United States Patent
Dev et al.

(10) Patent No.: US 10,068,769 B2
(45) Date of Patent: Sep. 4, 2018

(54) METHODS AND APPARATUS FOR PREVENTING COUNTER-DOPING DURING HIGH TEMPERATURE PROCESSING

(71) Applicant: Texas Instruments Incorporated, Dallas, TX (US)

(72) Inventors: Prakash Dalpatbhai Dev, Lubbock, TX (US); Fuchao Wang, Plano, TX (US); Nicholas Andrew Kusek, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/379,251

(22) Filed: Dec. 14, 2016

(65) Prior Publication Data
US 2018/0166280 A1 Jun. 14, 2018

(51) Int. Cl.
| | |
|---|---|
| H01L 21/31 | (2006.01) |
| H01L 21/225 | (2006.01) |
| H01L 21/324 | (2006.01) |
| H01L 21/02 | (2006.01) |
| H01L 21/311 | (2006.01) |
| H01L 21/3065 | (2006.01) |

(52) U.S. Cl.
CPC ...... *H01L 21/2251* (2013.01); *H01L 21/0217* (2013.01); *H01L 21/30655* (2013.01); *H01L 21/31111* (2013.01); *H01L 21/324* (2013.01)

(58) Field of Classification Search
CPC ........ A61K 2039/522; A61K 2039/523; A61K 2039/00; A61K 39/00; C12N 15/74; C12N 9/1241; H01L 31/182; H01L 31/1864; H01L 21/30655; H01L 21/31111; H01L 21/2251; H01L 21/324; H01L 21/0217
USPC .......................... 438/745, 753, 756, 757, 770
See application file for complete search history.

(56) References Cited

U.S. PATENT DOCUMENTS

| | | | |
|---|---|---|---|
| 2007/0259528 A1* | 11/2007 | Moriceau | H01L 21/7624 438/702 |
| 2011/0201172 A1* | 8/2011 | Chew | H01L 21/3081 438/424 |
| 2014/0213016 A1* | 7/2014 | Sheng | H01L 31/02167 438/97 |
| 2015/0279941 A1* | 10/2015 | Berger | H01L 29/02 257/9 |

* cited by examiner

*Primary Examiner* — Lan Vinh
(74) *Attorney, Agent, or Firm* — Jacqueline J. Garner; Charles A. Brill; Frank D. Cimino

(57) ABSTRACT

In a described example method, semiconductor wafer with a backside silicon nitride layer is encapsulated with a diffusion barrier layer prior to a high temperature anneal greater than about 1000 degrees Celsius. After the high temperature anneal the diffusion barrier layer and the backside silicon nitride layers are stripped.

20 Claims, 4 Drawing Sheets

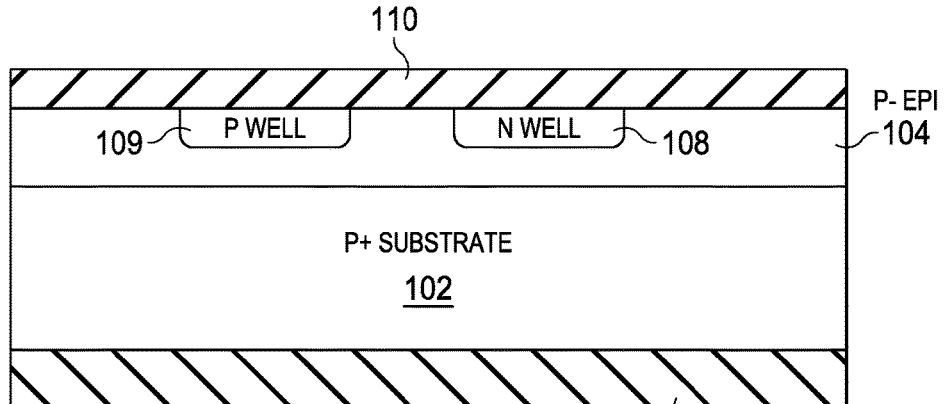
FIG. 1C
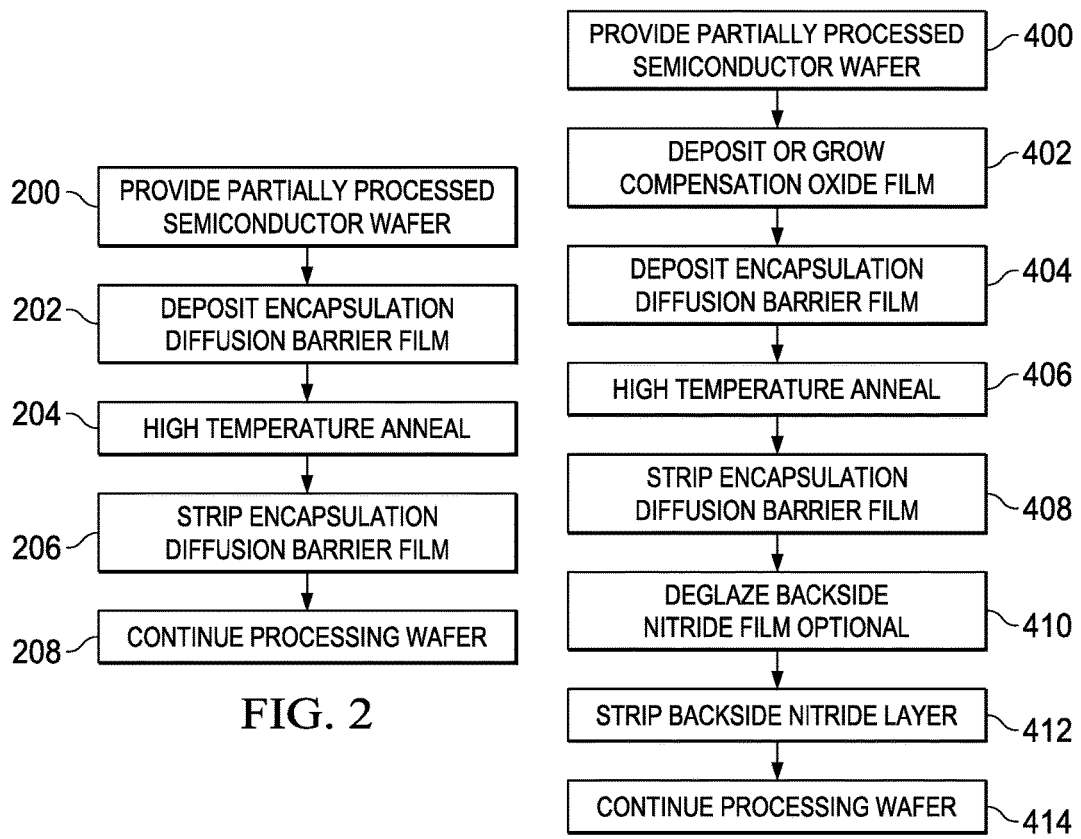
FIG. 2
FIG. 4

US 10,068,769 B2

METHODS AND APPARATUS FOR PREVENTING COUNTER-DOPING DURING HIGH TEMPERATURE PROCESSING

TECHNICAL FIELD

This relates generally to semiconductor wafer processing and more particularly to the prevention of counter-doping during high temperature processing.

BACKGROUND

Anneals of semiconductor wafers for extended times at temperatures greater than or equal to 1000° C. are frequently required to form high resistance buried diffusions or to form low doping concentration deep n-type diffused wells especially for semiconductor wafers used for high voltage integrated circuit (IC) chips. Semiconductor wafers used to form integrated circuits include silicon, gallium arsenide, and other III-V materials used for integrated circuit manufacture. Most semiconductor wafers are silicon. Epitaxial semiconductor layers can be formed over silicon wafers and over other wafer types. During a high temperature anneal, volatile dopant atoms such as boron or phosphorus may out-diffuse from the walls of the anneal furnace or dopant atoms may out-diffuse from highly doped regions on the semiconductor wafer and counter-dope low doped regions elsewhere on the same semiconductor wafer, or on an adjacent wafer. The counter-doping may change the resistance of the low doped regions sufficiently to cause circuits on the semiconductor wafer to fail.

A cross section of a partially processed semiconductor wafer for manufacturing integrated circuits (ICs) 100 is shown in FIG. 1A. A lightly doped p-type epitaxial layer (P-EPI) 104 overlies a heavily doped p-type substrate (P+SUBSTRATE) 102. The p-type dopant is typically boron.

An n-type well (N WELL) 108 is formed in an upper portion of the P-EPI layer 104. The n-type dopant may be phosphorus or arsenic.

A p-type well (P WELL) 109 may also be formed in the upper portion of the P-EPI layer 104. P WELL 109 may be lightly doped with a dopant concentration slightly greater than the P-EPI layer 104 or may be medium doped with a dopant concentrations substantially higher than the P-EPI layer 104.

A first oxide layer 110 overlies the P-EPI layer 104 and N WELL 108. A second oxide layer 106 underlies the P+SUBSTRATE 102.

Silicon nitride layer 112 covers the oxide layer 106 on the backside of the semiconductor wafer. Silicon nitride is an effective barrier to volatile dopants such as boron and phosphorus. If the silicon nitride layer 112 is damaged by scratches or is defective and has defects prior to the high temperature anneal, out-diffusion of dopant atoms will occur from P+SUBSTRATE 102. Depositing silicon nitride layer 116 on the top side oxide layer 110 prior to a high temperature anneal prevents boron atoms that can diffuse out of the backside of the P+SUBSTRATE 102 from counter-doping N WELL 108 and from adding additional dopant to the P WELL 109 during the high temperature anneal. High temperature anneals {e.g., >=1000 degrees Celsius) are used for various processes such as formation of the diffused N WELL 108.

In other examples, semiconductor wafers with lightly doped regions may become counter-doped by the out-diffusion of volatile dopant atoms from highly doped regions on the same wafer or from a nearby wafer. Improvements are therefore needed.

SUMMARY

In a described example, a semiconductor wafer with a backside silicon nitride layer is encapsulated with a diffusion barrier layer prior to a high temperature anneal. After the high temperature anneal the diffusion barrier layer and the backside silicon nitride layers are stripped. In another described example, the thickness of an oxide layer on the topside of a semiconductor wafer is increased prior to encapsulation with a diffusion barrier silicon nitride layer or with a diffusion barrier silicon oxynitride layer. The use of the increased oxide thickness compensates for any oxide loss that may occur during the subsequent strip of the diffusion barrier layer. The increased oxide thickness is used when oxide thickness is critical to subsequent processing steps such as a photo-lithography process step. After a high temperature anneal the diffusion barrier silicon nitride layer or the diffusion barrier silicon oxynitride layer and a backside silicon nitride layer are stripped.

BRIEF DESCRIPTION OF THE DRAWINGS

FIGS. 1A through 1C are cross sections of a semiconductor wafer during processing steps according to an embodiment method.

FIG. 2 is a flow diagram of a method embodiment.

FIG. 4 is a flow diagram of a method embodiment.

DETAILED DESCRIPTION OF EXAMPLE EMBODIMENTS

Corresponding numerals and symbols in the different figures generally refer to corresponding parts unless otherwise indicated. The figures are not necessarily drawn to scale.

Figure 1A:
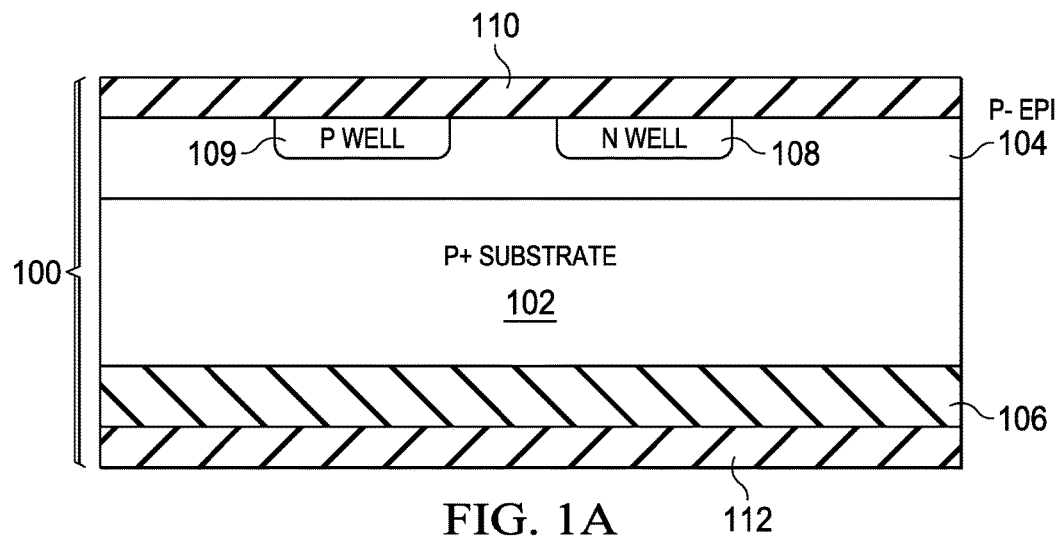

If the backside silicon nitride layer 112 in FIG. 1A is scratched, the underlying silicon dioxide layer 106 may be exposed. During a high temperature anneal (e.g. >=1000° C.) boron atoms may out diffuse from the P+SUBSTRATE 102; diffuse through the silicon dioxide layer 106; diffuse through the scratch; and then counter-dope N WELL 108 or additionally dope the P WELL 109. The counter-doping of the N WELL 108 or the additional doping of the P WELL 109 may change the resistance sufficiently to cause the integrated circuits formed on the semiconductor wafer 100 to fail.

The backside silicon nitride layer 112 is deposited using low pressure chemical vapor deposition (LPCVD). A typical furnace recipe for depositing this LPCVD nitride is to flow about 600 sccms of ammonia ($NH_3$) plus about 80 sccms of dichloro-silane ($SiH_2cl_2$) at a pressure of about 300 mTorr. The deposition temperature can be about 700° C. Other process conditions can also be used.

Figure 1B:
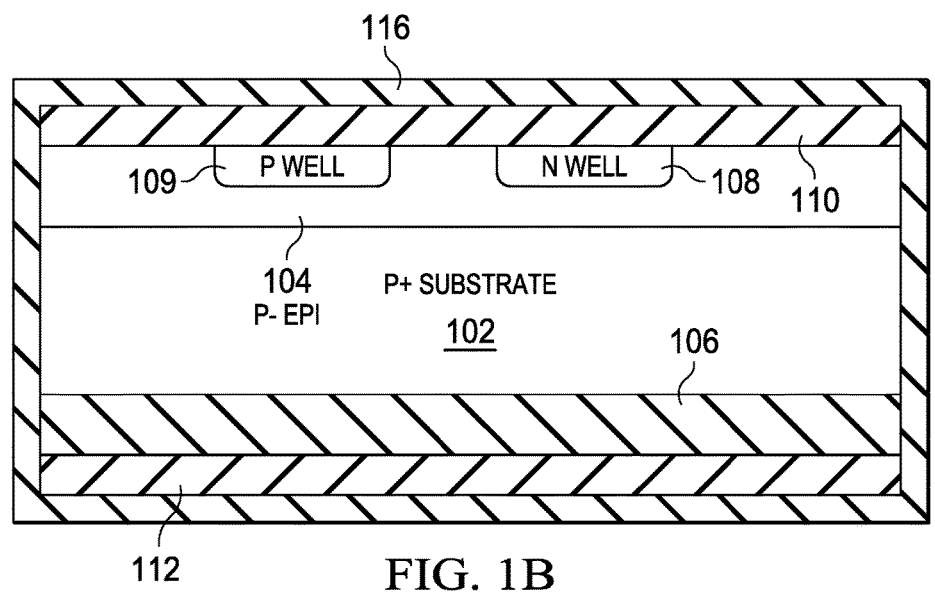

One solution for preventing counter-doping of an integrated circuit wafer during annealing at high temperatures (e.g., >=1000° C.) is illustrated in cross sections of semiconductor wafer 100 in FIGS. 1A through 1C and in the flow diagram in FIG. 2.

If semiconductor wafer 100 shown in FIG. 1A is annealed at a high temperature in a furnace in which highly doped n-type wafers have previously been annealed, volatile n-type dopant atoms such as phosphorus may out-diffuse from the walls of the furnace and counter-dope the lightly doped P-EPI region 104 and the P WELL region 109. The change in resistance caused by the counter-doping may cause the integrated circuits formed on the wafer 100 to fail.

If semiconductor wafer 100 is annealed at a high temperature in a furnace in which highly doped p-type wafers have previously been annealed, volatile p-type dopant atoms such as boron may out-diffuse from the walls of the furnace and counter-dope the N WELL 108 region and may additionally dope the P WELL 109. The change in N WELL 108 resistance caused by the counter-doping may cause the integrated circuits formed on the semiconductor wafer 100 to fail. An example is a low threshold voltage PMOS transistor. The change in resistance of the P WELL 109 caused by the additional doping may cause the integrated circuits formed on semiconductor wafer 100 to fail. An example is a low threshold voltage NMOS transistor.

In the embodiments, a solution to prevent counter-doping is to encapsulate the semiconductor wafer with a diffusion barrier layer, such as a silicon nitride layer or a silicon oxynitride layer, prior to the high temperature anneal. The diffusion barrier layer is removed after the high temperature anneal is completed. A silicon nitride diffusion barrier layer is used to illustrate the embodiments. Other diffusion barriers can be used with the embodiments.

In step 202 of the flow diagram in FIG. 2 and in the cross section in FIG. 1B, a diffusion barrier layer 116 is deposited encapsulating semiconductor wafer 100. The diffusion barrier layer 116 may be $Si_3N_4$ deposited with a recipe optimized to improve thickness uniformity across the semiconductor wafer 100 and optimized to minimize or eliminate diffusion barrier layer 116 defects.

The diffusion barrier silicon nitride layer 116 may be deposited with a thickness in the range of about 30 nm to 80 nm. More preferably the diffusion barrier silicon nitride layer 116 may be deposited with a thickness in the range of about 40 nm to 60 nm. In an example embodiment the diffusion barrier silicon nitride layer 116 is deposited with a thickness of about 50 nm.

In a typical diffusion barrier silicon nitride layer deposition recipe the flow rates of $NH_3$ and $SiH_2Cl_2$ are in a ratio of about 10:1. The $NH_3$ flow rate may be in the range of about 600 sccm and 1200 sccm. The deposition pressure may be in the range of about 200 mTorr to about 300 mTorr. The deposition temperature may be in the range of about 695° C. to about 715° C. In an example diffusion barrier silicon nitride layer 116 recipe, the flow of $NH_3$ is about 600 sccms and the flow of $SiH_2cl_2$ is about 60 sccms. The deposition pressure is about 300 mTorr. The deposition temperature is about 700° C. Useful deposition rates can be achieved from about 0.60 nm/min to about 0.75 nm/min. In an example process the deposition rate is about 0.67 nm/min.

In FIG. 2, in step 204 the semiconductor wafer is annealed at a high temperature of greater than or equal to 1000° C.

In step 206 the diffusion barrier layer 116 (FIG. 1B) and the backside nitride layer 112 (FIG. 1B) that encapsulate the wafer are stripped. Dilute hot phosphoric acid ($dilH_3PO_4$) is typically used to strip the silicon nitride layers.

FIG. 1C is a cross section of the semiconductor wafer 100 after the diffusion barrier layer 116 and the backside nitride layer 112 are removed. Depending upon the selectivity of the selected $dilH_3PO_4$ solution to silicon dioxide, between about 10 nm and 20 nm of topside oxide layer 110 may be etched away during the silicon nitride strip process. The semiconductor wafer 100 is now ready to continue processing in step 208 in FIG. 2.

Figure 3A:
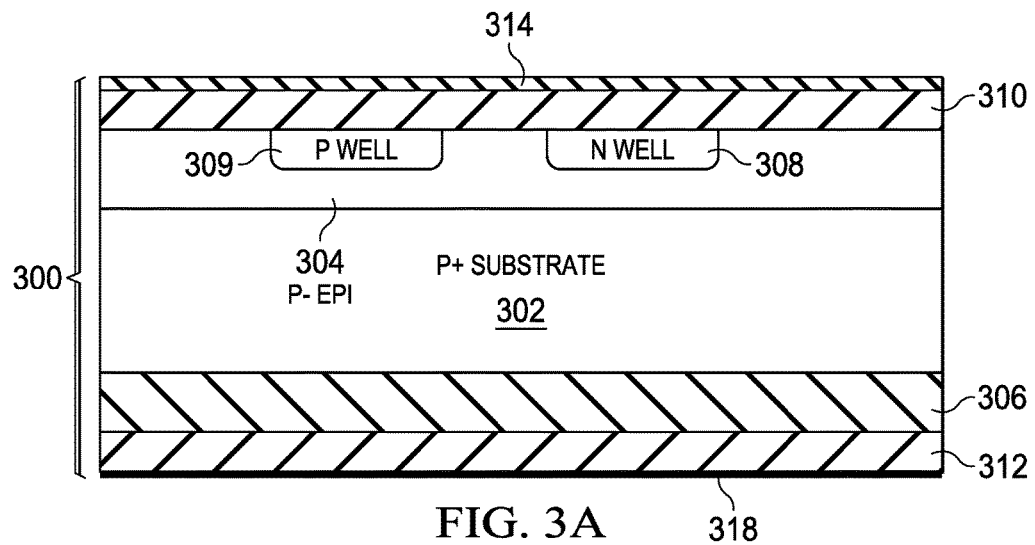
FIGS. 3A through 3D are cross sections of a semiconductor wafer during processing steps according to another embodiment.
Figure 3B:
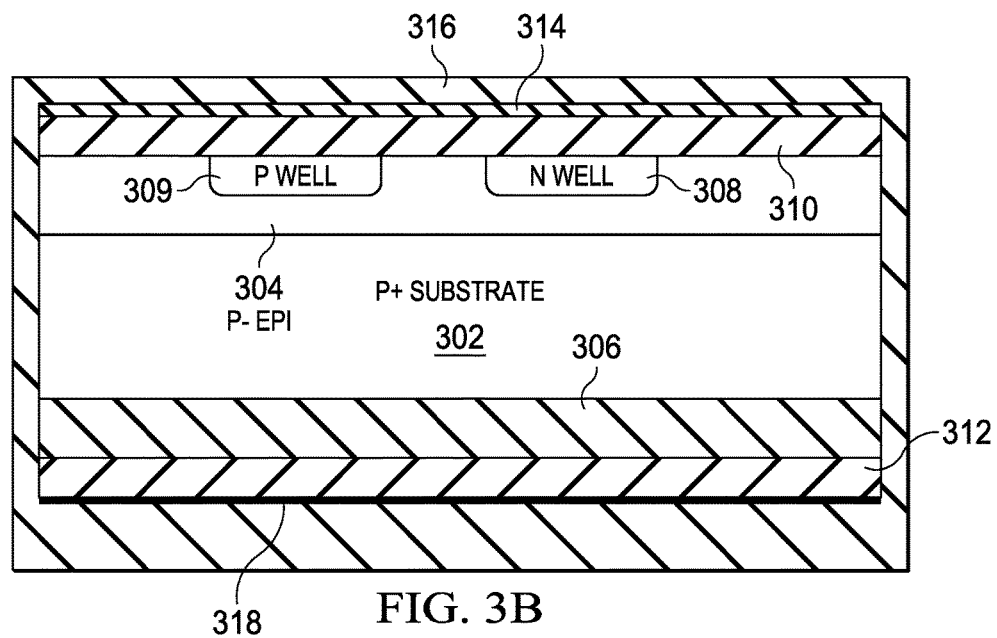
Figure 3C:
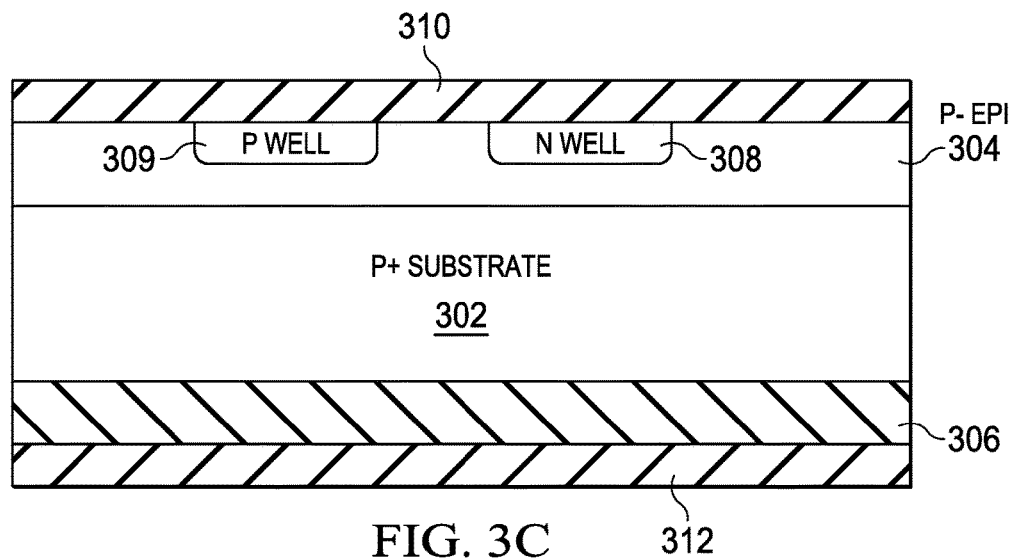

FIGS. 3A-3B show in cross sectional views an alternative embodiment. When silicon nitride layers are exposed to an ambient containing oxygen in an anneal furnace, the surface of the backside silicon nitride layer 112 may oxidize. Since $dilH_3PO_4$ is very selective to surface oxide 318 (see FIG. 3A), the surface oxide 318 is typically removed prior to stripping a silicon nitride layer 312. The surface oxide layer 318 (FIG. 3A) may be removed with a dilute hydrofluoric (dilHF) deglaze prior to the $dilH_3PO_4$ silicon nitride strip.

A surface layer of oxide 318 may grow on the backside nitride layer 312 prior to deposition of the encapsulating diffusion barrier silicon nitride layer 316 (FIG. 3B). When this occurs, a short dilHF deglaze may be required after the diffusion barrier nitride layer 316 is stripped, to remove the surface oxide 318 and to ensure complete stripping of the backside silicon nitride layer 312. About 15 nm of the topside oxide layer 304 may be etched away by the short dilHF deglaze. The change in thickness of the topside oxide layer 304 may cause problems for subsequent process steps. For example, during a photolithography step, reflections may be sensitive to the thickness of the topside oxide layer 304.

FIGS. 3A through 3D and flow diagram in FIG. 4 illustrate an embodiment process that compensates for the loss of topside oxide layer 310.

Semiconductor wafer 300 in FIG. 3A corresponds to the semiconductor wafer 100 in FIG. 1A. As shown in FIG. 3A and at step 402 of FIG. 4 a layer of compensation oxide 314 with a thickness in the range of about 10 nm to 20 nm is deposited or grown on the topside oxide layer 310 prior to encapsulation with the diffusion barrier silicon nitride 316. The thickness of the compensation oxide layer 314 depends upon the etch rate of the compensation oxide 314. In an example approximately 15 nm of compensation oxide 314 is thermally grown. This oxidation may also form a surface oxide 318 on the backside nitride layer 312.

In step 404 (illustrated in FIG. 3B) a diffusion barrier silicon nitride layer 316 that is described hereinabove is deposited. Typically the diffusion barrier silicon nitride layer 316 is deposited using LPCVD with a recipe optimized to improve across wafer thickness uniformity and to reduce or eliminate diffusion barrier silicon nitride layer 316 defects.

The diffusion barrier silicon nitride layer 316 may be deposited with a thickness in the range of about 30 nm to 80 nm. More preferably the diffusion barrier silicon nitride layer 316 may be deposited with a thickness in the range of about 40 nm to 60 nm. In an example solution the diffusion barrier silicon nitride layer 316 is deposited with a thickness of about 50 nm.

In step 406 the encapsulated semiconductor wafer 300 is annealed at a high temperature equal to or greater than 1000° C.

In step 408 the encapsulating diffusion barrier silicon nitride layer 316 is stripped.

If needed, in step 410 a dilHF deglaze may be performed to remove surface oxide 318 from the backside silicon nitride layer 312. As is illustrated in the cross section in FIG. 3C, the compensation oxide layer 314 may also be etched away during this dilHF deglaze step.

Figure 3D:
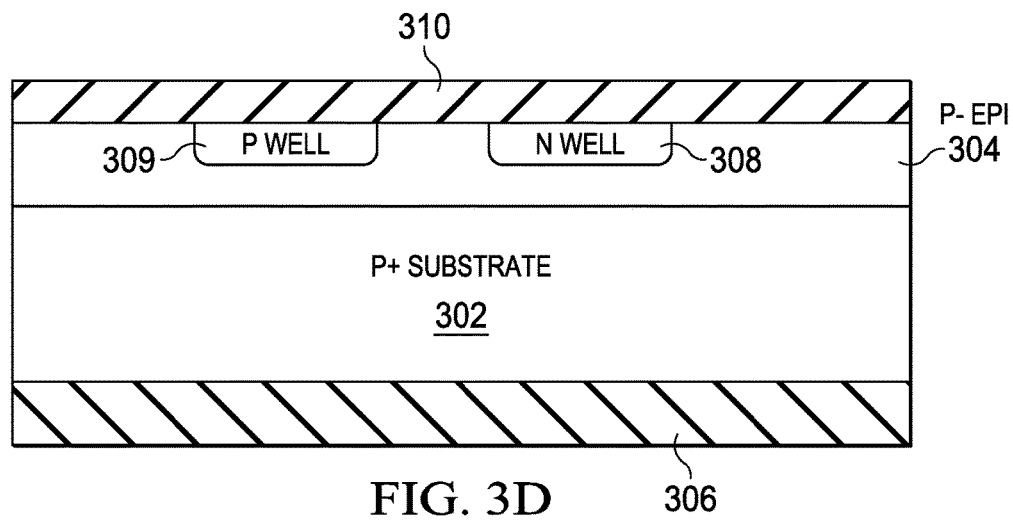

In step 412 an additional $dilH_3PO_4$ strip is performed to remove the backside silicon nitride layer 312. The cross section in FIG. 3D shows semiconductor wafer 300 after completion of the backside silicon nitride layer 312 strip.

The semiconductor wafer is now ready for further processing in step 414.

An additional benefit of depositing and removing the diffusion barrier silicon nitride layer 316 is that the semiconductor wafer 300 has significantly fewer particles and defects than semiconductor wafers that go through the high temperature anneal without the diffusion barrier silicon nitride layer 316. This aspect of the embodiment methods results in higher integrated circuit yield.

Modifications are possible in the described embodiments, and other embodiments are possible within the scope of the claims.

What is claimed is:

1. A method, comprising:
    depositing a diffusion barrier layer that encapsulates a semiconductor wafer, the semiconductor wafer having a silicon nitride layer on a backside of the semiconductor wafer and with a silicon dioxide layer on a topside of the semiconductor wafer;
    after depositing the diffusion barrier layer, annealing the semiconductor wafer at a temperature greater than or equal to about 1000° C.;
    after the annealing, stripping the diffusion barrier layer; and
    stripping the silicon nitride layer.

2. The method of claim 1, in which the diffusion barrier layer is a silicon nitride layer with a thickness between about 30 nm and 80 nm.

3. The method of claim 1, in which the diffusion barrier layer is a silicon nitride layer with a thickness between about 40 nm and 60 nm.

4. The method of claim 1, in which the diffusion barrier layer is a silicon nitride layer with a thickness of about 50 nm.

5. The method of claim 1, in which the diffusion barrier layer is a silicon nitride layer deposited using LPCVD with a $NH_3$ to $SiH_2Cl_2$ flow rate ratio of about 10:1; with a $NH_3$ flow rate of about 600 sccm; a deposition pressure of about 300 mTorr; a deposition temperature of about 700° C.; and a deposition rate of about 0.67 nm/min.

6. The method of claim 1, further including performing a dilute HF deglaze prior to stripping the diffusion barrier layer.

7. The method of claim 1, further including performing a dilute HF deglaze after stripping the diffusion barrier layer and before stripping the backside silicon nitride layer.

8. The method of claim 1, in which the diffusion barrier layer is a silicon nitride layer or a silicon oxynitride layer.

9. The method of claim 8 in which the diffusion barrier silicon nitride layer and the backside silicon nitride layer are stripped with hot phosphoric acid.

10. The method of claim 1, further comprising increasing a thickness of the silicon dioxide layer on the topside of the semiconductor wafer prior to depositing the diffusion barrier layer.

11. The method of claim 10, in which the thickness of the silicon dioxide layer is increased by between about 10 nm to 20 nm.

12. The method of claim 10, in which the thickness of the silicon dioxide layer is increased by about 15 nm.

13. A method, comprising:
    depositing a diffusion barrier layer that encapsulates a semiconductor wafer with a silicon nitride layer on a backside of the semiconductor wafer and with a silicon dioxide layer on a topside of the semiconductor wafer;
    annealing the semiconductor wafer at a temperature greater than or equal to about 1000° C.;
    stripping the diffusion barrier layer; and
    stripping the silicon nitride layer, in which the diffusion barrier layer is a silicon nitride layer deposited using LPCVD with a $NH_3$ to $SiH_2Cl_2$ flow rate ratio of about 10:1; with a $NH_3$ flow rate between about 600 sccm and 1200 sccm; a deposition pressure in a range of about 200 mTorr to about 300 mTorr; a deposition temperature between about 695° C. to about 715° C.; and a deposition rate between about 0.60 nm/min to about 0.75 nm/min.

14. A method, comprising:
    increasing a thickness of a silicon dioxide layer on a topside of a semiconductor wafer;
    depositing a silicon nitride or silicon oxynitride diffusion barrier layer that encapsulates the semiconductor wafer;
    annealing the encapsulated semiconductor wafer at a temperature greater than or equal to 1000° C.;
    after the annealing, deglazing the silicon nitride or silicon oxynitride diffusion barrier layer using dilute hydrofluoric acid;
    stripping the diffusion barrier silicon nitride layer or the diffusion barrier silicon oxynitride layer; and
    stripping the silicon nitride layer on a backside of the semiconductor wafer.

15. The method of claim 14, in which the thickness of the silicon dioxide layer is increased by 10 nm to 20 nm prior to depositing the silicon nitride or silicon oxynitride diffusion barrier layer.

16. The method of claim 14, in which the thickness of the silicon dioxide layer is increased by a thickness in a range of about 10 nm to about 20 nm prior to depositing the silicon nitride or silicon oxynitride diffusion barrier layer.

17. The method of claim 14, further including a dilute HF deglaze prior to stripping the silicon nitride on the backside of the semiconductor wafer.

18. The method of claim 14, in which the diffusion barrier is a silicon nitride layer deposited using LPCVD with a $NH_3$ to $SiH_2Cl_2$ flow rate ratio of about 10:1; with a $NH_3$ flow rate between about 600 sccm to about 1200 sccm; a deposition pressure in a range of about 200 mTorr to about 300 mTorr; a deposition temperature between about 695° C. and about 715° C.; and a deposition rate between about 0.60 nm/min to about 0.75 nm/min.

19. The method of claim 14, in which the diffusion barrier is a silicon nitride layer deposited using LPCVD with a $NH_3$ to $SiH_2Cl_2$ flow rate ratio of about 10:1; with a $NH_3$ flow rate of about 600 sccm; a deposition pressure of about 300 mTorr; a deposition temperature of about 700° C.; and a deposition rate of about 0.67 nm/min.

20. The method of claim 14, in which the silicon nitride layer and the diffusion barrier silicon nitride layer or diffusion barrier silicon oxynitride layer are subsequently stripped using hot phosphoric acid.

* * * * *